US009734432B2

(12) United States Patent
Griswold et al.

(10) Patent No.: US 9,734,432 B2
(45) Date of Patent: Aug. 15, 2017

(54) REDUCING ACQUISITION TIME

(75) Inventors: Mark A Griswold, Shaker Heights, OH (US); Eric Pierre, Cleveland Heights, OH (US); Nicole Seiberlich, Shaker Heights, OH (US); Stephen Yutzy, University Heights, OH (US); Vikas Gulani, Shaker Heights, OH (US); Jean Tkach, Cleveland Heights, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 2124 days.

(21) Appl. No.: 12/643,072

(22) Filed: Dec. 21, 2009

(65) Prior Publication Data
US 2010/0239143 A1 Sep. 23, 2010

Related U.S. Application Data

(60) Provisional application No. 61/161,789, filed on Mar. 20, 2009.

(51) Int. Cl.
| G06K 9/00 | (2006.01) |
| G06K 9/62 | (2006.01) |
| G06T 11/00 | (2006.01) |
| G01R 33/561 | (2006.01) |

(52) U.S. Cl.
CPC ........ G06K 9/6247 (2013.01); G01R 33/5611 (2013.01); G06T 11/003 (2013.01)

(58) Field of Classification Search
CPC ...... G01R 33/5608; G06T 2207/30016; G06T 2207/10088
USPC ......... 382/128, 131; 600/407, 300, 410, 544
See application file for complete search history.

(56) References Cited

U.S. PATENT DOCUMENTS

| 5,739,691 | A | * | 4/1998 | Hoenninger, III | 324/322 |
| 5,779,634 | A | * | 7/1998 | Ema et al. | 600/407 |
| 5,873,823 | A | * | 2/1999 | Eidelberg et al. | 600/407 |
| 5,961,454 | A | * | 10/1999 | Kooy et al. | 600/407 |
| 7,795,869 | B1 | * | 9/2010 | Bydder | 324/309 |
| 7,873,405 | B2 | * | 1/2011 | Burbar | 600/436 |
| 7,929,737 | B2 | * | 4/2011 | Sirohey et al. | 382/128 |
| 2003/0126279 | A1 | * | 7/2003 | Hu et al. | 709/233 |

(Continued)

OTHER PUBLICATIONS

Ying, et al.; On Tikhonov Regularization for Image Reconstruction in Parallel MRI; Proceedings of IEEE Engineering in Medicine and Biology Conference, Sep. 2004, pp. 1056-1059.

*Primary Examiner* — Minnah Seoh
*Assistant Examiner* — Teresa Williams
(74) *Attorney, Agent, or Firm* — Quarles & Brady LLP; Jack Cook

(57) ABSTRACT

Systems, methods, apparatus, and other embodiments associated with reducing imaging acquisition time are described. One example method includes accessing an under-sampled data set and a library of previously acquired data sets. The method includes producing an approximation of the under-sampled data set by transforming data stored in the library. The method includes producing a sparsified data set from the approximation and the under-sampled data set and then reconstructing the sparsified data set into a sparse image using a reconstruction technique configured to reconstruct sparse data. The method includes producing a fully-sampled approximation of the under-sampled data set and producing a final reconstructed image from the sparse image and the fully sampled approximation.

30 Claims, 10 Drawing Sheets

(56) References Cited

U.S. PATENT DOCUMENTS

2008/0009706 A1* 1/2008 Theriault ................ 600/410
2009/0136104 A1* 5/2009 Hajian et al. ............ 382/128

* cited by examiner

REDUCING ACQUISITION TIME

TECHNICAL FIELD

This application relates generally to reducing acquisition time in imaging. This application also relates generally to reducing reconstruction time in imaging. More particularly, this application relates to reducing acquisition time in magnetic resonance imaging (MRI) by accounting for expected signal in an under-sampled data set as a function of data available in an atlas of MRI images and estimations. In one example this involves making an intelligent choice for a regularization image.

SUMMARY

Normal, healthy human brains are remarkably similar. Put more plainly, most brains look the same. Thus, magnetic resonance images of healthy human brains exhibit many similarities. This facilitates designing and operating systems in a manner that reduces and/or minimizes the amount of data that needs to be acquired to provide an accurate image of a human brain. Conventional regularization systems have traditionally created a regularization image from data acquired from the object to be imaged at the time the object is imaged. Creating the regularization image therefore adds time to a procedure. Example systems facilitate acquiring a relevant useful regularization image from a set of stored images, thereby not incurring the additional time associated with conventional systems.

Some MRI techniques efficiently identify and remove similarities between images to facilitate focusing on differences between images. Therefore, it may be possible to identify pathology or abnormalities in a human brain by comparing stored data to acquired data, where the acquired data and stored data are associated with and/or are human brain scans. The comparisons may even be made between data from under-sampled brain scans. Under-sampling involves collecting less than an exhaustive set of data concerning an object to be imaged.

Other human anatomical features, cells, tissues, and so on may also be so similar that acquired data and/or images may be compared to stored data and/or images to facilitate removing expected signal. While there may be variations in size and orientation between stored data and incoming under-sampled data, registration processes including scaling, rotation, and repositioning can account for many of these differences.

BRIEF DESCRIPTION OF THE DRAWINGS

The accompanying drawings, which are incorporated in and constitute a part of the specification, illustrate various example systems, methods, apparatus, and other example embodiments of the material claimed herein. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
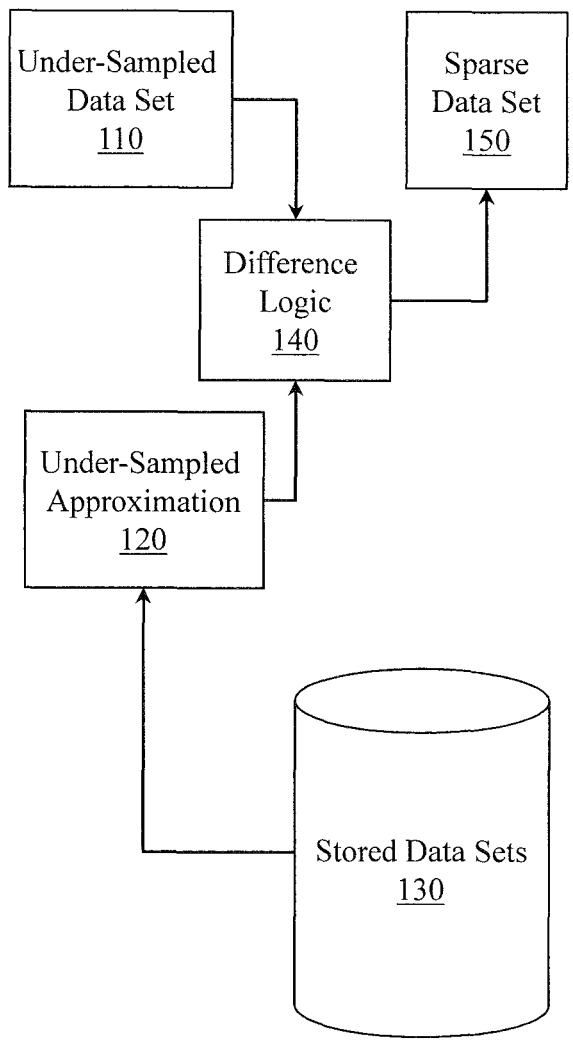
FIG. 1 illustrates an example system associated with reducing acquisition time using atlas based sparsification of MRI images and estimations associated therewith (ABSINTHE).

Example systems, apparatus, and methods described herein facilitate isolating difference information in an under-sampled data set associated with a scanned object. Example systems, apparatus, and methods determine how much information in an incoming under-sampled data set can be explained or accounted for by prior knowledge. Assuming that the fit between an incoming under-sampled data set and prior knowledge is not perfect, example systems, apparatus, and methods attempt to reduce and/or minimize the amount of information that needs to be acquired and/or reconstructed to image portions of a scanned object that cannot be explained by the prior knowledge.

Difference information is isolated by removing data associated with an expected signal in the under-sampled data set by referencing previously acquired data associated with the expected signal. Unlike conventional systems, the previously acquired data is not acquired from the object to be imaged at the time the object is being imaged. Instead, the previously acquired data is taken from a stored library that can include data from other objects (e.g., brains) imaged at other times. Comparing an incoming data set to a stored data set, or to a set of data derived from a stored data set, facilitates eliminating data from the incoming data set and thus reducing the amount of data to be reconstructed. Additionally, determining volumes in an object that can be explained using under-sampled data facilitates reducing volumes for which more completely sampled data may be desired and acquired.

Data that can be explained by previously stored data can be removed from an incoming data set to produce difference information, which may be stored in a sparsified data set. Once the difference information has been isolated, the difference information can be reconstructed more quickly than an entire data sample that includes both data that cannot be explained by previously stored data and data that can be explained by previously stored data. The reconstructed difference information can then be used to produce an image of the object. The image may include a portion produced by reconstructing the difference information and a portion produced by reconstructing the expected signal associated with an approximation of the under-sampled MRI data set.

In one example, the reconstruction associated with an expected signal may be pre-computed. The portion associated with the expected signal may be provided by an approximation of a fully sampled data set. Reconstructing just the portion associated with the difference information may reduce reconstruction time. The difference information may be associated with a region of greater interest in the object. The region of interest may be smaller than the entire region of interest. Acquisition time can be reduced because a fully sampled data set or other time consuming acquisition techniques can be limited to a smaller volume associated with an abnormality, suspected pathology, and so on. Acquisition time can also be reduced over conventional systems that construct a regularization image because additional data that is used by conventional systems to build the regularization image does not need to be acquired by MR techniques. Instead, the regularization image can be taken from a library of stored images. Over time, the library can be populated with relevant, useful images that facilitate accounting for incoming signal. For example, over time, images associated with a set of normal healthy brains that are imaged can be stored for future use as regularization images.

Since an MRI brain scan will hopefully contain mostly normal anatomy, the new information in an MRI brain scan can be very small. The new information may be related only to pathology or abnormalities. By removing the portions of an under-sampled data set that correspond to normal, healthy human brain, only data associated with the pathology or abnormality remains to be acquired and reconstructed. Since the pathology or abnormality may represent a smaller area or volume than an entire brain, there may be a decrease in information content in the under sampled data that needs to be reconstructed. Reducing the information content facilitates reducing processing overhead (e.g., processor cycles, time). Additionally, since there is less information to process, there may be a reduction in the number of pixels that alias with one another. Since there are fewer pixels that alias with one another, it may be possible to quickly produce images with fewer aliasing artifacts.

Parallel imaging facilitates reducing scan time. High parallel imaging acceleration factors can be achieved with reduced noise enhancement when applying the GRAPPA (GeneRalized Autocalibrating Partially Parallel Acquisitions) reconstruction to sparse images. Example systems, apparatus, and methods described herein may combine the approaches of reducing information in under-sampled data sets and doing reconstruction on the reduced information content using reconstruction techniques having reduced noise enhancement (e.g., GRAPPA). In one example, an under-sampled data set to be reconstructed is first sparsified by correlating the under-sampled data set to stored data to identify the features of the under-sampled data set that are common to the stored data. In conventional regularization techniques, there is no stored data. Instead, the "stored" data is acquired from the object to be imaged. In example systems there is stored data that may include data taken from another patient. In one example, the stored data may be stored in a database. The stored data may be referred to as an atlas because it provides a roadmap to normal anatomy. The stored data may be added to as additional normal anatomy is scanned over time. The stored data can include data from different patients.

Recall that most brains are remarkably similar, which facilitates identifying common features in a current brain being scanned and other brains of other people that have been scanned. Since common features can be identified, these common features can be subtracted out of the under-sampled data set. In one example, stored data associated with the under-sampled anatomy may have been acquired using the same acquisition parameters (e.g., degree of under-sampling). In this example, the under-sampled data may be directly compared to the stored data. In another example, the stored data and the under-sampled data may have been acquired using different acquisition parameters, in which case a transformation may be performed before comparing the under-sampled data and the stored data. The stored data, or an approximation of an under-sampled data set that is derived from the stored data, may initially be misaligned on one or more dimensions with respect to an incoming data set. Thus, the two data sets may be registered to each other with respect to, for example, size, shape, rotation, scale, and so on, before being compared.

Once the under-sampled data and the stored data can be compared, difference logic can identify what is different between the two data sets to facilitate removing the common information from the under-sampled data set. In conventional systems that acquire data to construct the regularization image there is an additional step to create the regularization image. Example systems already have useful, relevant images stored. In one example, the common information may be removed by subtracting it from the under-sampled data set. This leaves a sparse image data set that only has the differences between the under-sampled anatomy and the collection of anatomical images in the database. The sparsified data set can then be reconstructed. In one example, the sparse image may be reconstructed using GRAPPA. In another example, the sparse image may be reconstructed using Compressed Sensing. Compressed Sensing requires images to be sparse in some transform domain to facilitate optimal reconstruction. In one example, the sparsified data set may be empty, or may be so small, that all or substantially all of the information in the under-sampled data set can be accounted for by prior knowledge. In this case, the sparsified data set may not be reconstructed. In another example, the sparsified data set may have attributes that are examined to determine whether to reacquire the under-sampled data using different acquisition parameters. For example, under-sampling parameters may be changed, the pulse sequence may be changed, pulse sequence parameters (e.g., TE, TR, trajectory) may be changed, the volume to be imaged according to the new parameters may be changed, and so on.

While this application describes MRI brain scans, one skilled in the art will appreciate from the teachings herein that scans of other things (e.g., blood, femur) acquired using other technologies (e.g., PET, SPECT) may be processed. Therefore the stored data can acquire images of these other things (e.g., blood, femur) from which a "regularization image" can be selected rather than constructed. Furthermore, while sparsifying a data set is described, one skilled in the art will appreciate from the teachings herein that another application involves providing a binary answer to a question like "Does this blood sample include any sickle cells?" The answer may be determined based on what information, if any, resides in a sparsified data set. For example, if all the information in a blood sample can be accounted for by previously stored information concerning healthy blood cells, then there are no diseased blood cells in the sample and a sparsified data set would be empty. However, if the sparsified data set was not empty, then a second sparsification could occur where blood cells that did not match healthy blood cells are compared to approximations of certain well known diseased cells (e.g., sickle cell, hairy cell leukemia, Ebola). Brain tumors (e.g., glioblastomas) may not have a regular size, shape, or tendency and thus a pathologist may be consulted to view an image produced from the first sparsified data set. However, other things (e.g., well known blood cell shapes) may have regular sizes, shapes, or tendencies and thus may be identified using the two step sparsification using two sets of previously stored information. In the two step approach, example systems, methods, and apparatus may provide a non-invasive approach for working with infectious diseases, for working with immune-compromised individuals, and so on. Conventional regularization systems have no stored library of interesting pathology and thus cannot make the same decision.

FIG. 1 illustrates data sets and processes associated with reducing acquisition and/or reconstruction time by facilitating the acquisition of under-sampled data sets and by removing some data from an under-sampled data set. Removing data from the under-sampled data set may be referred to as sparsifying the data set. The sparsification may be performed based on a comparison of newly acquired data to data derived from stored sets of data and/or the stored sets of data. The stored sets of data may be associated with anatomical features (e.g., brains). The stored sets of data may be referred to as an atlas. The stored sets of data can include data from other previously imaged objects (e.g., brains) from other patients. Thus sparsifying the data set can be performed using previously acquired data rather than additional data acquired from the object being imaged, which can save procedure time.

FIG. 1 illustrates an under-sampled data set 110 being accessed. In one example, an MRI apparatus may be controlled to acquire the under-sampled data set 110. In another example, the under-sampled data set 110 may be acquired from apparatus including a computed tomography (CT) apparatus, a positron emission tomography (PET) apparatus, a fluorescence molecular tomography (FMT) apparatus, and a single positron emission computed tomography (SPECT) apparatus. Incoming data may be transformed in some way prior to becoming the under-sampled data set 110. The under-sampled data set 110 may be acquired using a set of acquisition parameters (e.g., R=4, where R describes a reduction factor). The under-sampled data set 110 may exhibit overlapping pixels due to under-sampling. These overlapping pixels conventionally add noise to a GRAPPA reconstruction. Reducing the number of overlapping pixels facilitates limiting noise added to a GRAPPA reconstruction. Reducing the amount of data in the under-sampled data set 110 facilitates reducing the number of overlapping pixels. Example systems, methods, and apparatus may pre-process the under-sampled data set 110 before reconstruction to reduce the size of the data set that is to be reconstructed. The pre-processing may reduce the number of overlapping pixels.

In one example, stored data sets 130 may be accessed to facilitate sparsifying the under-sampled data set 110 into the sparse data set 150. Data from the stored data sets 130 may be associated with anatomy that was previously imaged. The data sets 130 may store, for example, a library of MRI brain scans. Different scans may have been acquired with similar and/or different acquisition parameters from other patients at other times. Thus, in one example, the stored data sets 130 may be heterogeneous with respect to size, format, acquisition parameters, and so on.

Data from the stored data sets 130 may be processed before being used to sparsify the under-sampled data set 110. In one example, given a sufficiently large training data set having enough images relevant to the imaged anatomy, under-sampled k-space data in under-sampled data set 110 can be approximated from data stored in the stored data sets 130. In one example, the approximation may be performed using a PCA analysis. The PCA analysis facilitates producing an image of what the under-sampled k-space data should look like if it was completely healthy and normal. Principal component analysis (PCA) is a mathematical procedure that transforms a number of possibly correlated variables into a smaller number of uncorrelated variables called principal components. The first principal component accounts for as much of the variability in the data as possible. Successive components account for as much of the remaining variability as possible in order. PCA can reduce dimensionality in a data set by retaining those characteristics of the data set that contribute most to its variance. The dimensionality is reduced by retaining lower-order principal components that identify the greatest variances and by ignoring higher-order principal components that identify lesser amounts of variances.

PCA involves calculating the eigenvalue decomposition of a data covariance matrix or computing a singular value decomposition of a data matrix. PCA results identify what variable in a set of variables or what data in a set of data explains the variability in the variables or data. Thus, when processing MRI images, PCA identifies portions of images that cause variability. PCA provides mathematics for revealing the internal structure of data in a way that explains the variance in the data. PCA is defined mathematically as an orthogonal linear transformation. The orthogonal linear transformation transforms data from one coordinate system to another coordinate system where the greatest variance by any projection of the data appears on the first coordinate. Since the first coordinate is related to the greatest variability in the data, the first coordinate is called the first principal component. While PCA is described, one skilled in the art will appreciate that other analysis methods (e.g., independent component analysis) may be employed. Independent component analysis (ICA) is a computational method for separating a multivariate signal into additive subcomponents. ICA assumes mutual statistical independence of non-Gaussian source signals.

Recall that all brains look alike, except for their pathology or abnormalities. Therefore, an image of what a brain should look like under the conditions used to produce the under-sampled data set 110 can be produced from the stored data sets 130. The data to be used for a particular sparsification may be stored in under-sampled approximation 120. In one example, fully sampled eigenvectors, with channel configuration and contrast related to the acquired data in under-sampled data set 110, are under-sampled using the same acceleration factor and number of auto-calibration signal (ACS) lines as were employed to acquire the under-sampled k-space data set 110. The coefficients of the linear combination that give the best under-sampled PCA approximation 120 are then used on the fully sampled eigenvectors to compute a fully-sampled approximation 190. While PCA is described, one skilled in the art will appreciate from the teachings herein that other techniques may be used to produce under-sampled approximation 120. The other techniques may include, for example, linear combinations, non-linear combinations, registration, and so on.

A difference logic 140 is configured to produce a sparse data set 150 from the under-sampled approximation 120 and the raw under-sampled data set 110. In one example, the difference logic 140 subtracts the under-sampled approximation 120 from the under-sampled data set 110. One of ordinary skill in the art will appreciate that difference logic 140 may produce sparse data set 150 using other techniques. If the sparse data set 150 is empty, or contains less than a threshold amount of data, then the object being imaged may be deemed to be healthy, normal, or in some other state for which no reconstruction is required.

Figure 2:
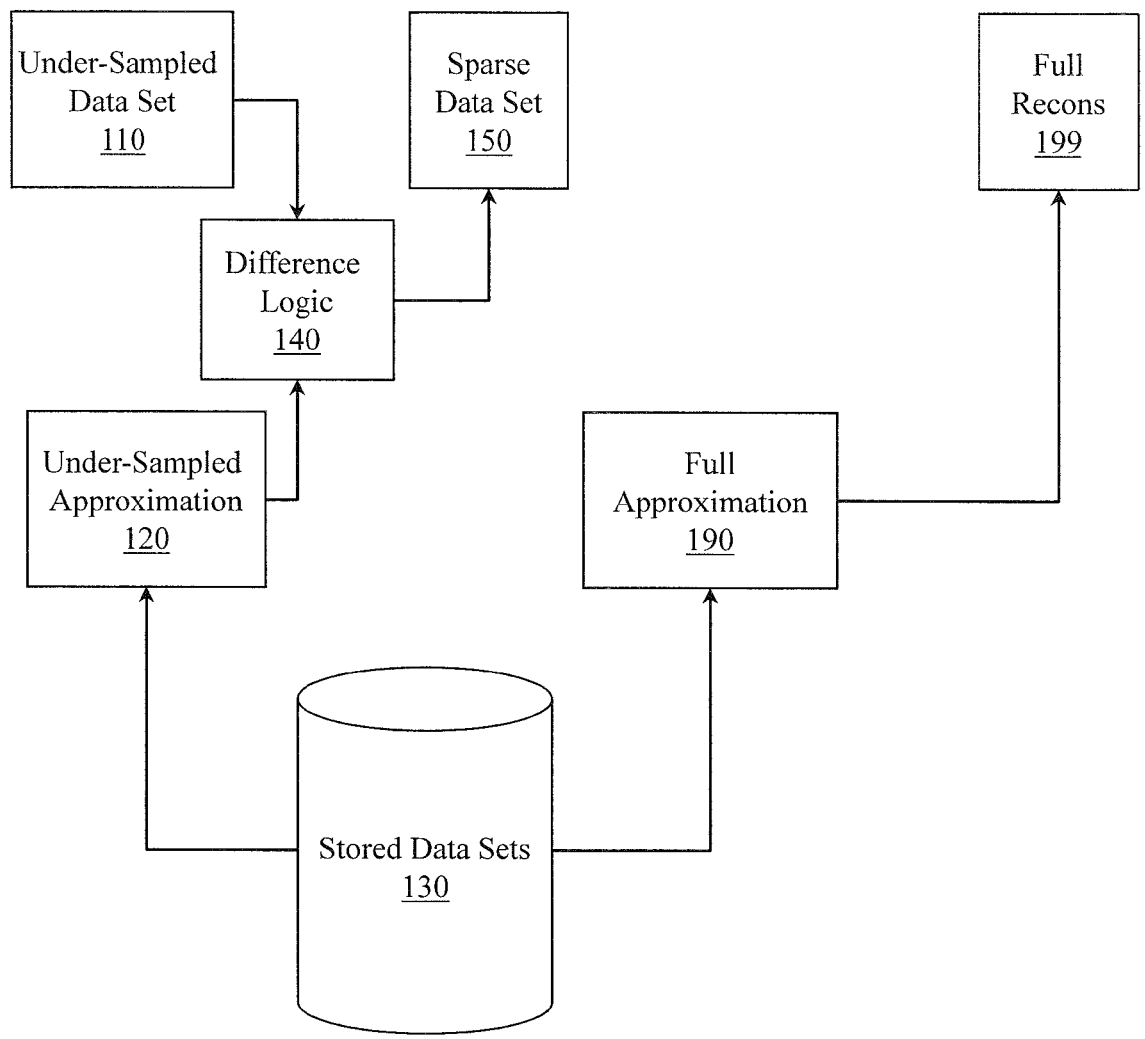
FIG. 2 illustrates another example system associated with reducing acquisition time.

FIG. 2 illustrates a system where a full reconstruction 199 is produced from a full approximation 190 that relies only on previously stored data. This system would not reconstruct any of the under-sampled data set 110 or any of the sparse data set 150 in cases where the sparse data set 150 is empty or contains less information than an information threshold.

Figure 3:
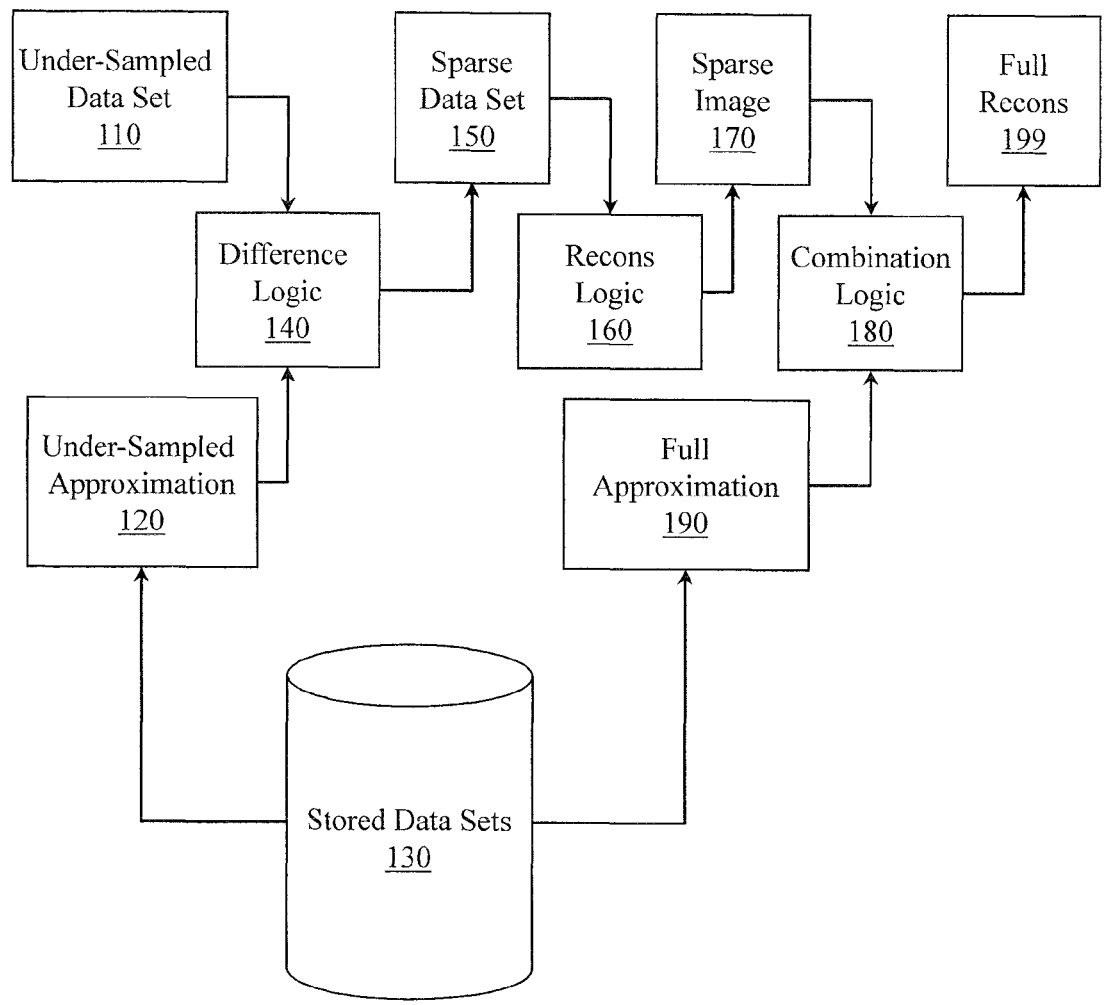
FIG. 3 illustrates another example system associated with reducing acquisition time.

FIG. 3 illustrates a system that produces the full reconstruction 199 from the full approximation 190 and from a sparse image 170. After the sparsification, the sparse image 170 can be reconstructed using, for example, GRAPPA based reconstruction. The sparse image 170 can then be combined with a full approximation 190 of the under-sampled data set to produce a final image 199 that includes both the differences (e.g., pathology) and the approximation of the normal anatomy.

The sparse data set 150 may be reconstructed by a reconstruction logic 160 into the sparse image 170. In one example, reconstruction logic 160 may perform the reconstruction using a GRAPPA reconstruction. While a GRAPPA reconstruction is described, one skilled in the art will appreciate that other parallel reconstructions that work with sparse data sets may be employed. In one example, the contents, attributes (e.g., size, density), and other information associated with sparse data set 150 may be analyzed to determine whether to control an MRI apparatus to re-acquire under-sampled data set 110, to control acquisition parameters for a region of interest in the object being sampled, and so on. By way of illustration, analyzing the sparse data set 150 may reveal that an abnormality or pathology exists. Based on this revelation, an MRI apparatus may be controlled to acquire different data for a region bounding the abnormality or pathology. The data may differ from the original under-sampled data set 110 due to under-sampling parameters, acquisition parameters, acquisition technique, and so on.

Recall that a full approximation 190 may be produced from the stored data sets 130. Combination logic 180 is therefore configured to produce a final reconstructed image 199 from the full approximation 190 and the sparse image 170. In one example the combination logic 180 may add the full approximation to the sparse image 170. One skilled in the art will appreciate that combination logic 180 can produce the final reconstructed image 199 using other techniques.

Figure 4:
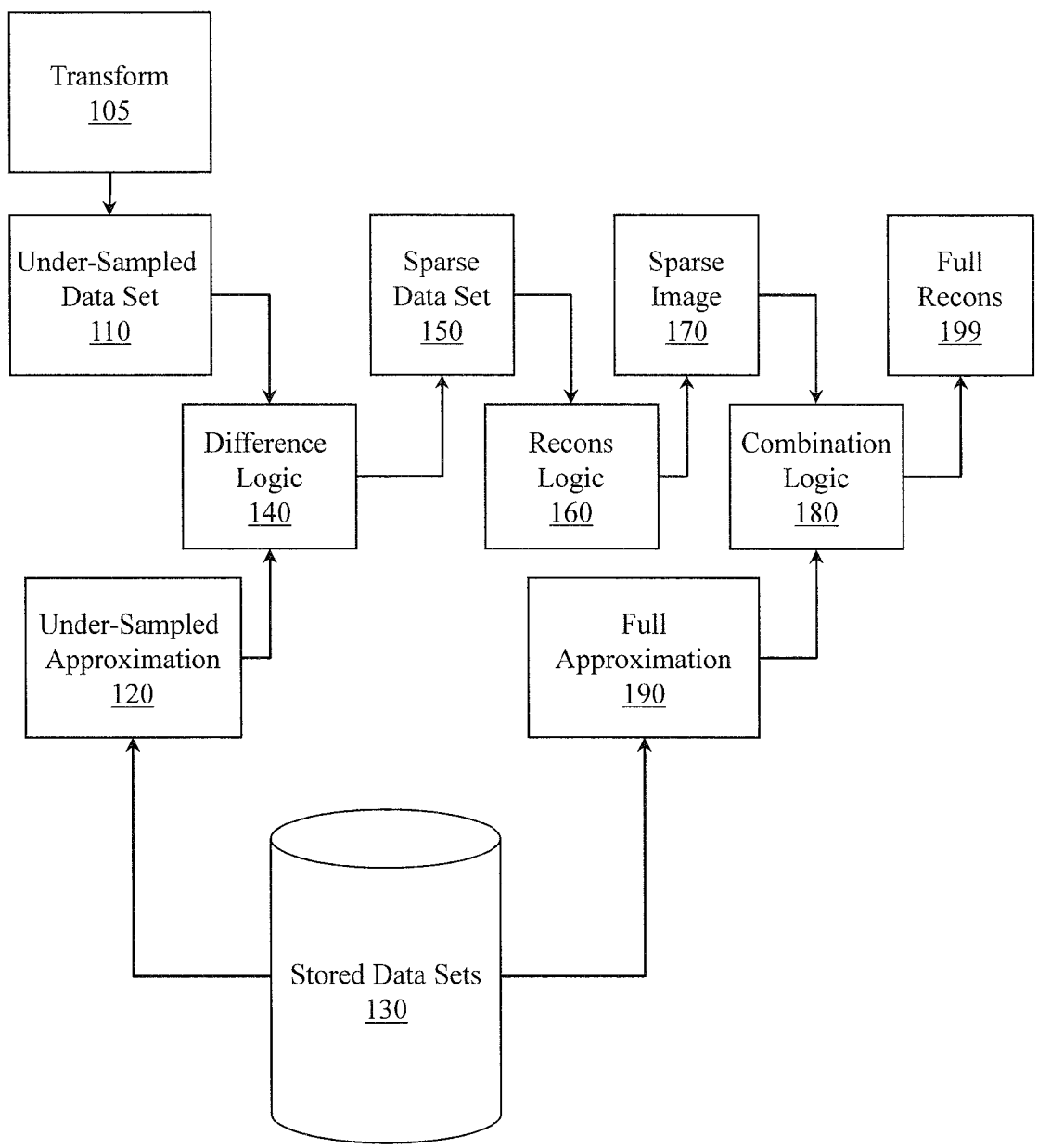
FIG. 4 illustrates another example system associated with reducing acquisition time.

In one example illustrated in FIG. 4 the under-sampled data set 110 may be processed by a transform 105 before being provided to difference logic 140.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 5:
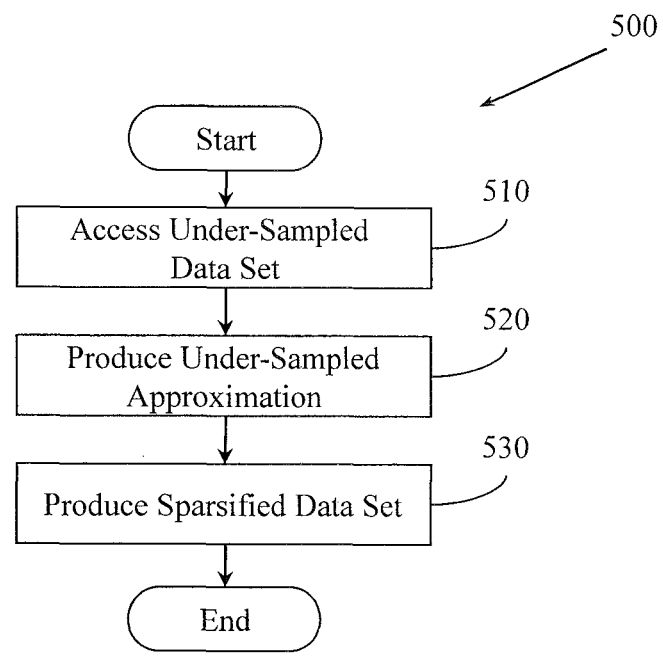
FIG. 5 illustrates an example method associated with reducing acquisition time.

FIG. 5 illustrates a method 500 for reducing medical imaging acquisition time. Method 500 includes, at 510, accessing an under-sampled data set. In one example, the under-sampled data set is associated with a scan performed by an MRI apparatus. One skilled in the art will appreciate that the scan may be performed by other apparatus including, for example, a CT apparatus, a PET apparatus, a FMT apparatus, and a SPECT apparatus. In one example, the scan is a brain scan. The brain scan, or other scans, may be performed according to a set of acquisition parameters. The acquisition parameters may include, for example, an acceleration factor, an acquisition pattern, an under-sampling degree, and a number of auto-calibration signal (ACS) lines to acquire. The degree of under-sampling may be controllable. Therefore, one under-sampled data set may be acquired according to one set of acquisition parameters while another under-sampled data set may be acquired according to another set of acquisition parameters.

Method 500 also includes, at 520, producing an approximation of the under-sampled raw data set by transforming data stored in a library of previously acquired data sets. The data stored in the library may be, for example, fully sampled data. In one example, the library of previously acquired data sets stores brain scans. The brain scans may be of the brains of other patients. The transforming may be performed according to a set of transformation parameters. The transformation parameters reconcile the stored data to the under-sampled data. In one example, producing the approximation includes performing a PCA on data stored in the library. In this example, the approximation is an under-sampled PCA approximation.

Method 500 also includes, at 530, producing a sparsified data set from the approximation and the under-sampled data set. In one example, producing the sparsified data set includes subtracting the approximation from the under-sampled data set. In conventional systems producing the sparsified data set may need to wait until additional data is acquired from the object being imaged during the procedure.

Figure 6:
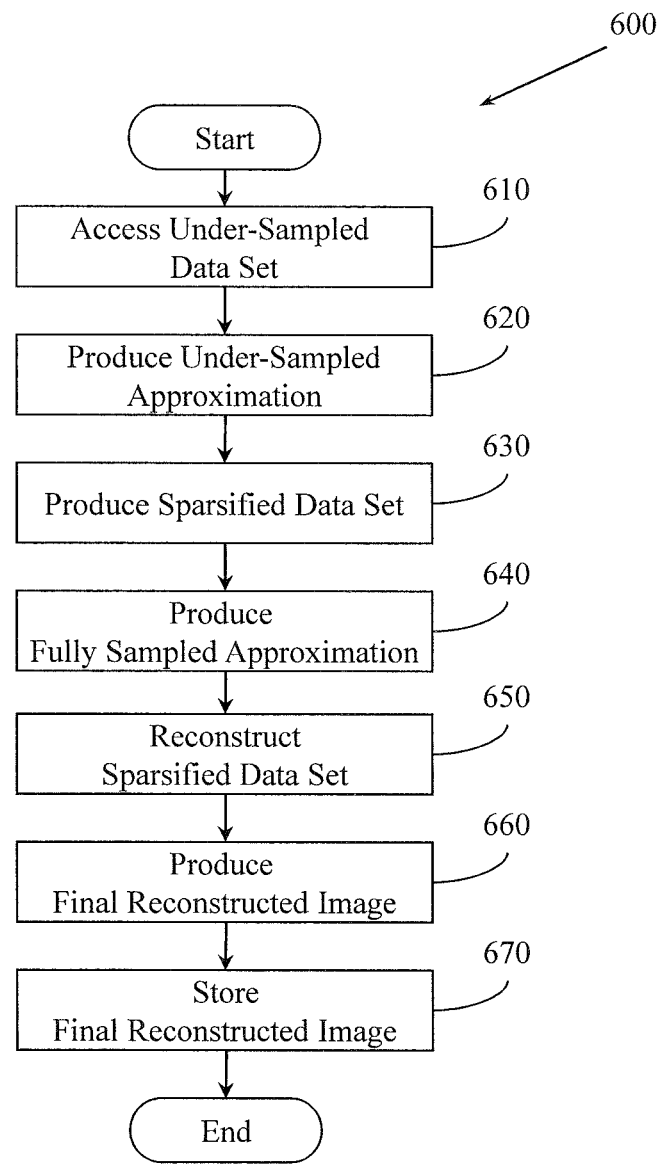
FIG. 6 illustrates an example method associated with reducing acquisition time.

FIG. 6 illustrates a method 600 that includes some actions similar to those described in connection with method 500 (FIG. 5). For example, method 600 includes accessing an under-sampled data set at 610, producing an approximation at 620, and producing a sparsified data set at 630.

Method 600 also includes, at 640, producing a fully-sampled approximation of the under-sampled data set based, at least in part, on the transformation parameters and on previously stored data. In conventional systems, a fully-sampled approximation may be produced from data acquired during the procedure while in example systems the fully-sampled approximation may be produced from previously stored data. In one example, producing the fully-sampled approximation includes identifying coefficients of a linear combination that produced an under-sampled PCA approximation and applying the coefficients to fully sampled eigenvectors associated with the fully sampled data to compute the fully-sampled approximation.

Method 600 also includes, at 650, reconstructing the sparsified data set into a sparse image using a reconstruction technique configured to reconstruct sparse data. In different examples the reconstruction technique may be a parallel reconstruction, a GRAPPA reconstruction, a Compressed Sensing reconstruction, a multiparametric optimization reconstruction, a parallel sparse data reconstruction, and so on. In one example, all or substantially all of the information encoded in the under-sampled data set may be accounted for by information encoded in a previously stored data set. This could occur if, for example, data associated with a sampled brain was healthy, normal, and matched data associated a stored brain scan. In this case, the sparse data set would be empty or substantially empty, and thus there would be no need to reconstruct the sparsified data set. No similar result can be achieved by conventional systems performing a standard regularization technique because previously acquired and stored data is not consulted for selecting the regularization image.

Method 600 also includes, at 660, producing a final reconstructed image from the sparse image and the fully sampled approximation. Producing the final reconstructed image may include adding the reconstructed sparse image and the fully sampled approximation. In one example, if the sparsified data set is empty, the final reconstructed image may be taken completely from the fully sampled approximation.

Method 600 also includes, at 670, storing the final reconstructed image in a computer-readable medium. While storing the final reconstructed image is described, one skilled in the art will appreciate that the final reconstructed image may also be provided to a display, may be provided to an image analysis logic, and so on.

While FIG. 6 illustrates various actions occurring in serial, it is to be appreciated that various actions illustrated in FIG. 6 could occur substantially in parallel. By way of illustration, a first process could access under-sampled data while a second process could produce the approximation and the fully sampled-approximation. A third process could produce the sparse image and a fourth process could reconstruct the sparse image and add the fully sampled approximation to make the final image. While a number of processes are described, it is to be appreciated that a greater and/or lesser number of processes could be employed and that lightweight processes, regular processes, threads, and other approaches could be employed.

Figure 7:
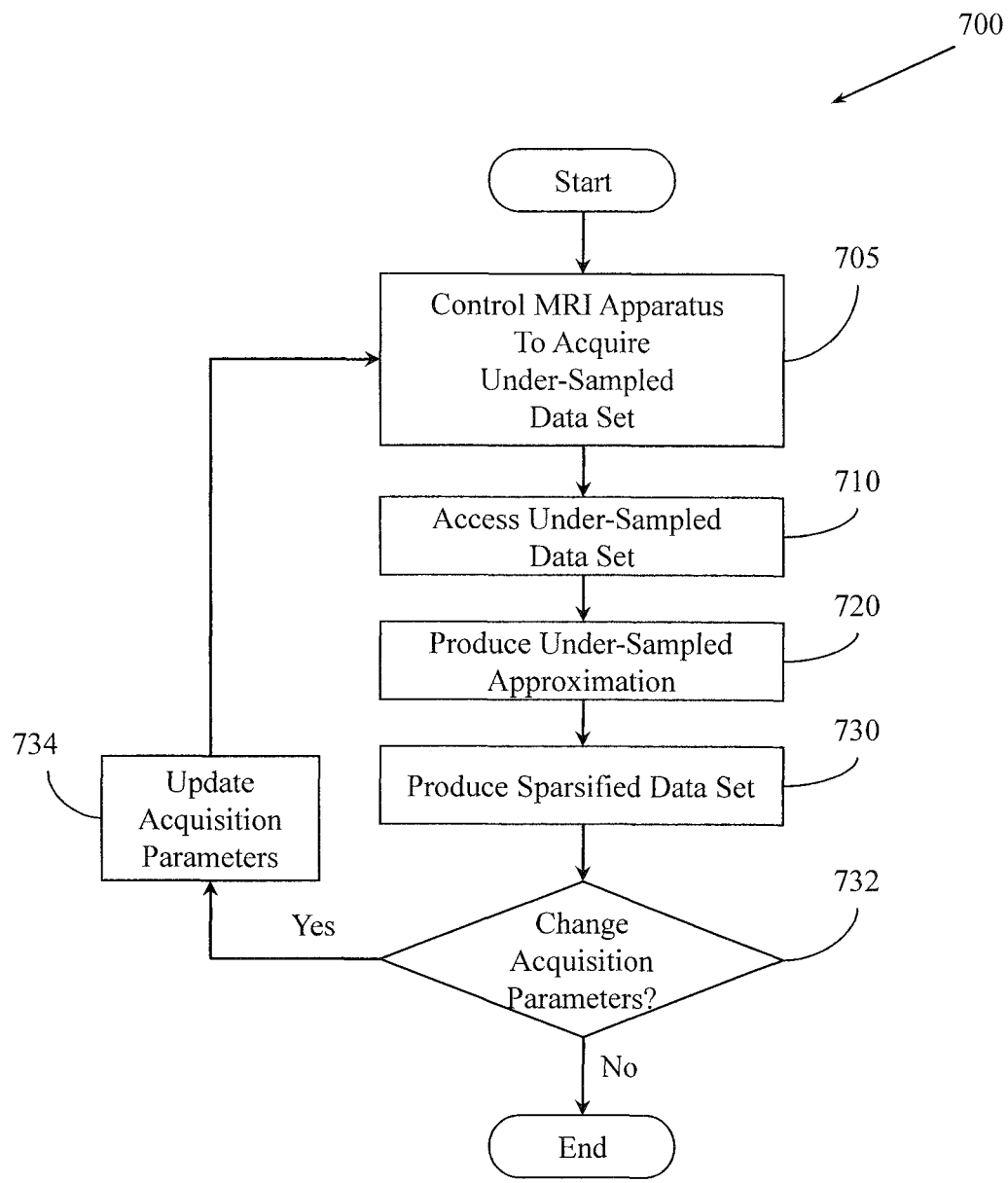
FIG. 7 illustrates an example method associated with reducing acquisition time.

FIG. 7 illustrates a method 700 that includes some actions similar to those described in connection with method 500 (FIG. 5) and method 600 (FIG. 6). For example, method 700 includes accessing an under-sampled data set at 710, producing an approximation at 720, and producing a sparsified data set at 730. Method 700 includes, at 705, controlling an MRI apparatus to acquire the under-sampled data set according to a set of acquisition parameters. In one example, an initial under-sampled data set may be acquired using an initial set of acquisition parameters. In one example, the sparsified data set may be examined. The examination may yield information upon which a decision to control an MRI apparatus may be made. Thus, based on the information, a second under-sampled data set may be acquired according to a second set of acquisition parameters. One skilled in the art will appreciate that in one example multiple sets of under-sampled data may be acquired using multiple different sets of acquisition parameters. The different acquisition parameters may include location, region, or volume to image, size of region or volume to image, pulse sequence, trajectory, degree of under-sampling, and so on.

Method 700 includes making a determination, at 732, after producing the sparsified data set at 730. The determination at 732 concerns whether another set of raw data is to be acquired and, if so, what acquisition parameters are to be used. If the determination is yes, then processing proceeds to 734, where the acquisition parameters are updated, and then returns to 705. One skilled in the art will appreciate that data may be acquired by a first apparatus or process, sparsified by a second apparatus or process, and reconstructed by a third apparatus or process. One skilled in the art will also appreciate that multiple actions may be performed by a single process or apparatus.

Figure 8:
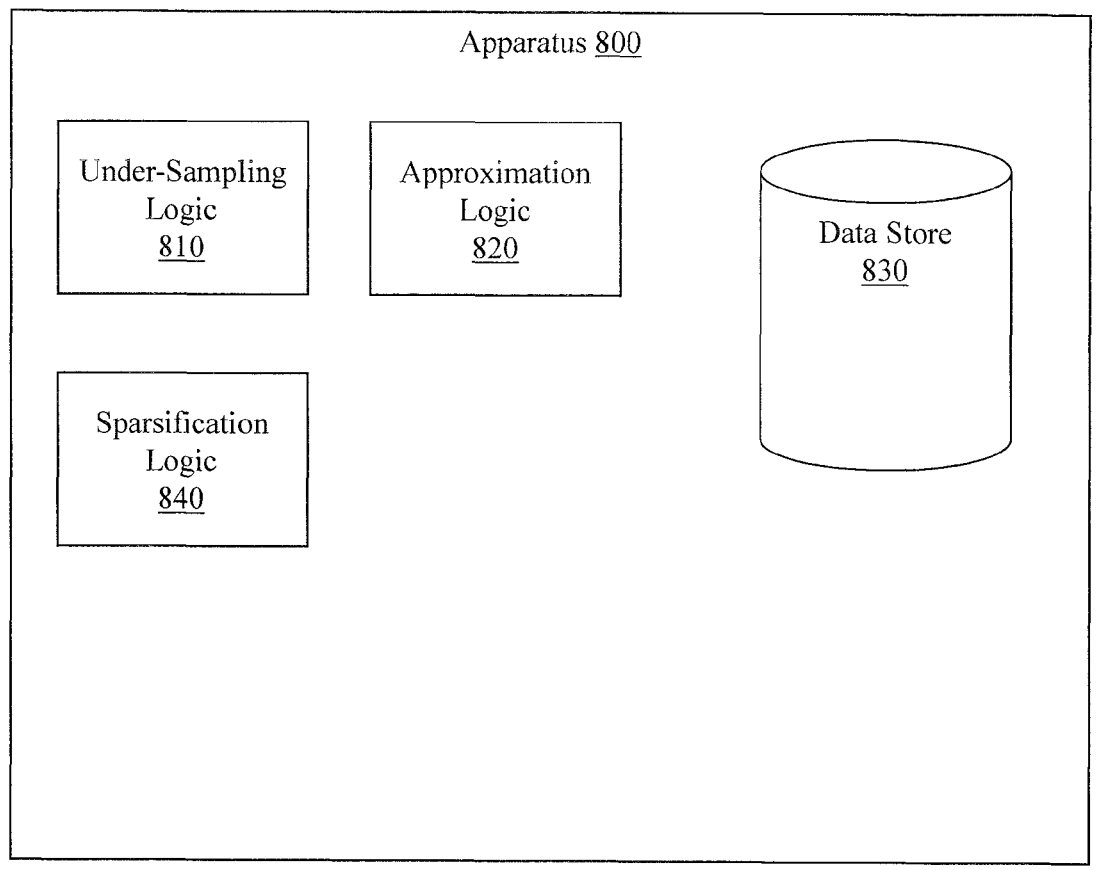
FIG. 8 illustrates an example apparatus associated with reducing acquisition time.

FIG. 8 illustrates an apparatus 800 configured to reduce acquisition time. Apparatus 800 may also reduce reconstruction time by reducing the amount of data to be reconstructed. Apparatus 800 includes an under-sampling logic 810 configured to access an under-sampled MRI scan data set. In one example, the under-sampled MRI scan data set comprises data associated with a nuclear magnetic resonance signal emitted by a portion of a human brain. The under-sampled MRI scan data set may be acquired using a first set of acquisition parameters.

Apparatus 800 also includes a data store 830 to store, for example, previously acquired fully-sampled scans. The data store 830 may store more data over time as more scans of healthy anatomical features are acquired. The additional data may facilitate the approximation logic 820 producing better approximations of both under-sampled data and fully-sampled data. While healthy anatomical features are described, one of ordinary skill in the art will appreciate that fully-sampled MRI scans of pathology, diseased tissue, diseased cells, and so on, may be stored. For example, certain diseases may present very consistent, recognizable items. By way of illustration, blood cells affected by sickle cell anemia, hairy cell leukemia, Ebola, and so on, may be immediately recognizable and matchable. While fully sampled data sets are described in association with data store 830, one of ordinary skill in the art will appreciate that in one example data store 830 may also store under-sampled data sets.

Apparatus 800 also includes an approximation logic 820 configured to produce an approximation of the under-sampled MRI data set from the fully-sampled MRI scan data sets or from other data sets stored in data store 830. The approximation may be, for example, an under-sampled approximation. In one example, the approximation logic 820 is configured to produce the approximation of the under-sampled MRI data set from the fully-sampled MRI scan data sets by performing a PCA on fully-sampled MRI scan data. In one example, a number of fully-sampled MRI scan data sets may be analyzed to facilitate producing an approximation whose quality exceeds a pre-determined threshold.

Apparatus 800 also includes a sparsification logic 840 configured to produce a sparse data set from the under-sampled MRI scan data set and data acquired and/or derived from data store 830. In one example, the sparsification logic 840 is configured to produce the sparse data set from the under-sampled MRI scan data set and an under-sampled approximation by subtracting the approximation from the under-sampled MRI scan data set. While subtraction is described, one skilled in the art will appreciate that other sparsification approaches may be taken.

Figure 9:
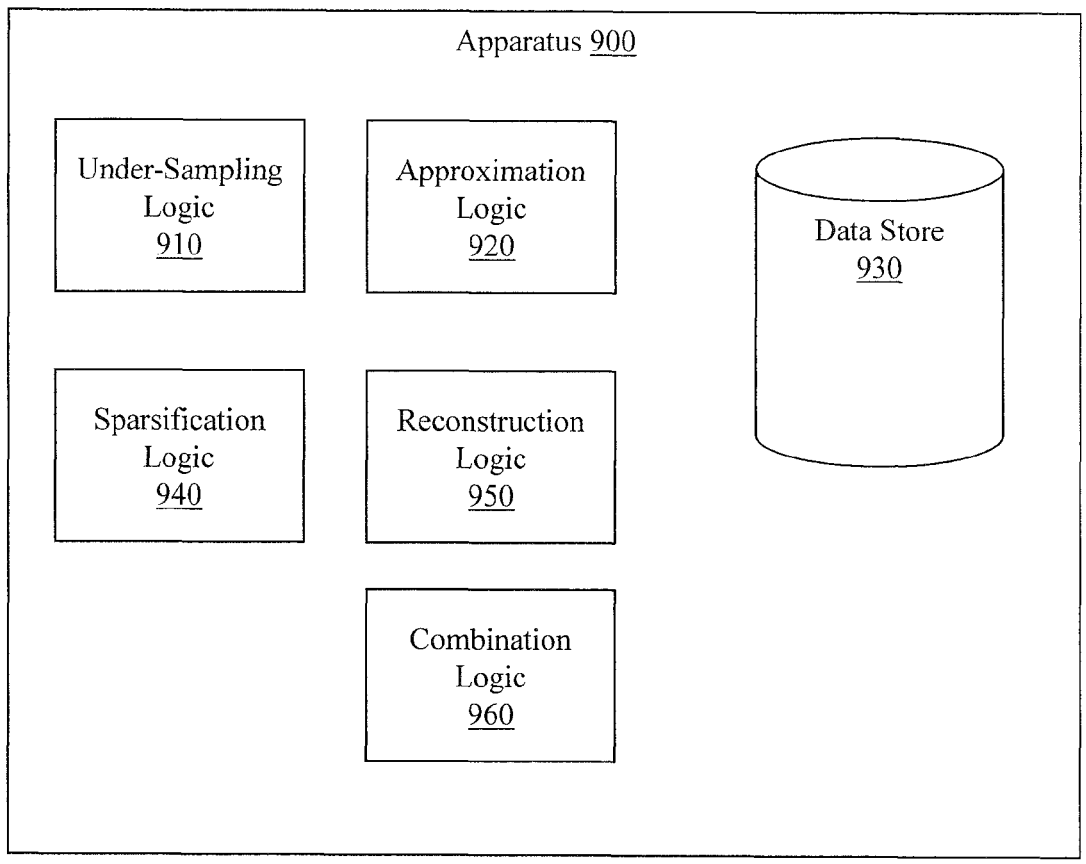
FIG. 9 illustrates an example method associated with reducing acquisition time.

FIG. 9 illustrates an apparatus 900. Apparatus 900 includes a number of elements similar to those described in connection with apparatus 800 (FIG. 8). For example, apparatus 900 includes an under-sampling logic 910, an approximation logic 920, a data store 930, and a sparsification logic 940. Apparatus 900 also includes a reconstruction logic 950 configured to reconstruct a first image from the sparse data set. In one example, the reconstruction logic 950 is configured to reconstruct the first image from the sparse data set using one of, a parallel reconstruction, a GRAPPA reconstruction, a Compressed Sensing reconstruction, a multi-parametric optimization reconstruction, and a parallel sparse data reconstruction. One skilled in the art will appreciate that other reconstruction methods may be employed.

Apparatus 900 also includes a combination logic 960 configured to produce a final image from an approximation developed from data retrieved from data store 930 and the first image. The approximation developed from data retrieved from data store 930 may be, for example, a fully-sampled approximation. In one example, the combination logic 960 is configured to produce the final image by adding the first image to the fully-sampled approximation. While addition is described, one skilled in the art will appreciate that other combinatorial approaches may be employed. Recall that the first image was reconstructed from a subset of the under-sampled data. So, three separate improvements over conventional acquisition and subsequent reconstructions of complete sets of fully-sampled data sets are achieved. First, data may be under-sampled, which facilitates reducing acquisition time. Second, less than the complete set of under-sampled data may be reconstructed, which facilitates reducing reconstruction time. Third, additional data used to create a regularization image does not have to be acquired because a fully-sampled regularization image can be selected from the previously stored data, which may include data from other patients.

Figure 10:
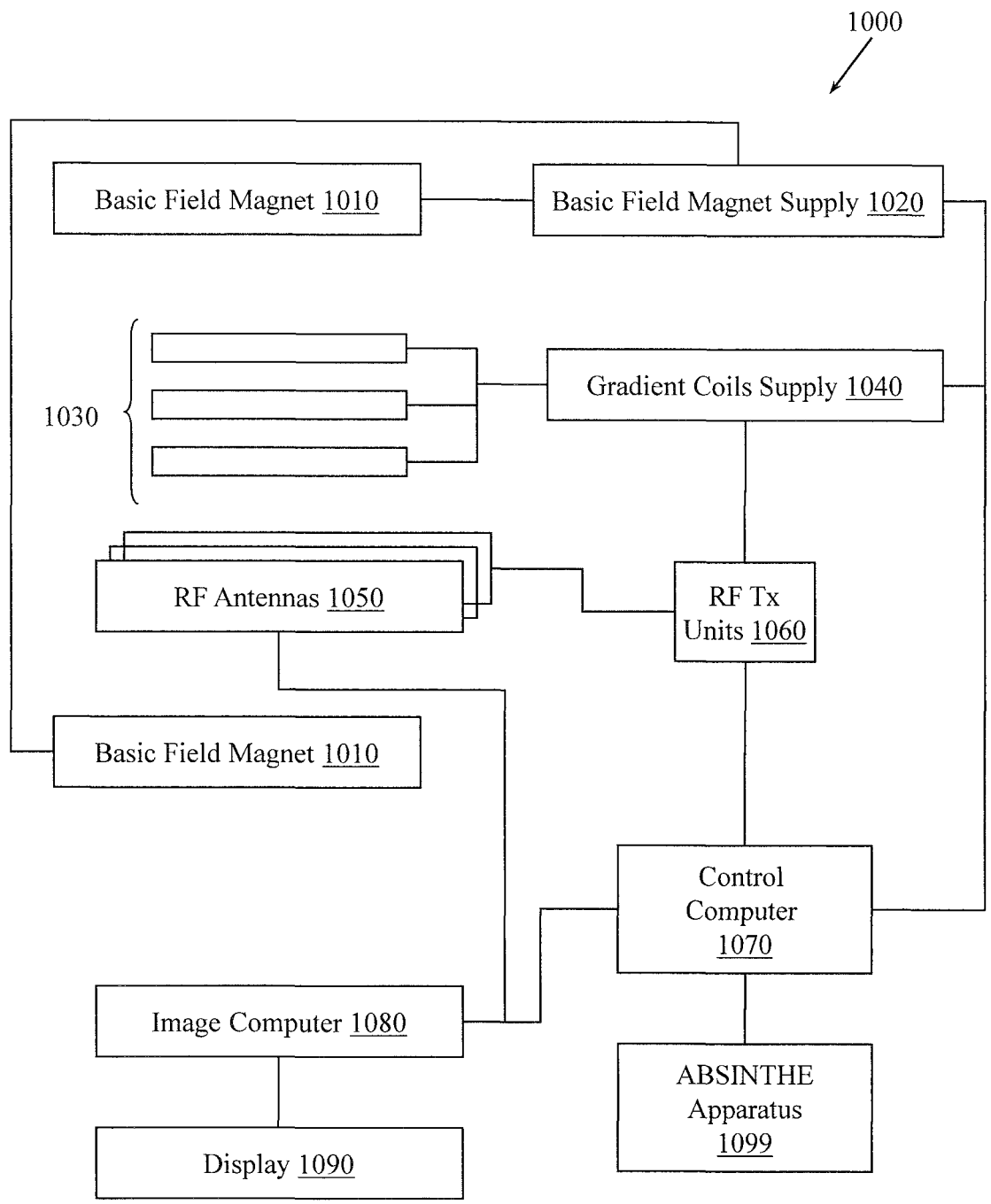
FIG. 10 illustrates an MRI apparatus associated with reducing acquisition time using MRI based atlas based sparsification of MRI images and estimations.

FIG. 10 illustrates an example MRI apparatus 1000 configured with an Absinthe apparatus 1099 to facilitate reducing acquisition and/or reconstruction time. Recall that Absinthe is an acronym for Atlas Based Sparsification of MRI Images and estimations associated therewith. The Atlas refers to the library or sets of stored data. Over time, the Atlas may grow, providing greater opportunities for accurate approximations of both under-sampled data and fully-sampled data. The Atlas can include data from a number of patients.

Sparsification refers to removing expected signal from an image. Recall that most brains look alike. Therefore a large amount of expected signal may be found in an under-sampled image of a brain. The difference information (e.g., tumor, aneurism, pathology) may be isolated in the sparse image and reconstructed very quickly as compared to reconstructing an entire data set, whether under-sampled or fully-sampled. Since brains look alike, a regularization image can be selected from stored scans rather than created from additional data for the brain being scanned. Recall also that some disease cells look alike. Therefore a large amount of expected signal may be found in an under-sampled image of blood cells, of cancer cells, of tissue, and so on. The Absinthe apparatus 1099 may be configured with elements of example apparatus described herein and/or may perform example methods described herein. Therefore, the Absinthe apparatus 1099 may provide means (e.g., hardware, software, firmware) for isolating difference information in an under-sampled MRI data set associated with an object. The Absinthe apparatus 1099 may isolate difference information by removing data associated with an expected signal in the under-sampled MRI data set. The expected signal may be found by referencing previously acquired MRI data associated with the expected signal. The Absinthe apparatus 1099 may also provide means (e.g., hardware, software, firmware) for reconstructing the difference information. The Absinthe apparatus 1099 may also provide means (e.g., hardware, software, firmware) for providing an image of the object. The image of the object may be formed from two parts. A first part may be the result of the reconstruction of the difference information. The second part may be the result of a reconstruction of an approximation associated with expected signal as identified in previously stored (e.g., atlassed) data.

The apparatus 1000 includes a basic field magnet(s) 1010 and a basic field magnet supply 1020. Ideally, the basic field magnets 1010 would produce a uniform $B_0$ field. However, in practice, the $B_0$ field may not be uniform, and may vary over an object being imaged by the MRI apparatus 1000. MRI apparatus 1000 may include gradient coils 1030 configured to emit gradient magnetic fields like $G_S$, $G_P$ and $G_R$. The gradient coils 1030 may be controlled, at least in part, by a gradient coils supply 1040. In some examples, the timing, strength, and orientation of the gradient magnetic fields may be controlled, and thus selectively adapted during an MRI procedure.

MRI apparatus 1000 may include a set of RF antennas 1050 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 1050 may be controlled, at least in part, by a set of RF transmission units 1060. An RF transmission unit 1060 may provide a signal to an RF antenna 1050.

The gradient coils supply 1040 and the RF transmission units 1060 may be controlled, at least in part, by a control computer 1070. In one example, the control computer 1070 may be programmed to control an MRI device as described herein. The magnetic resonance signals received from the RF antennas 1050 can be employed to generate an image and thus may be subject to a transformation process like a two dimensional fast Fourier Transform (FFT) that generates pixilated image data. The transformation can be performed by an image computer 1080 or other similar processing device. The image data may then be shown on a display 1090. While FIG. 10 illustrates an example MRI apparatus 1000 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A computer-readable medium storing computer-executable instructions that when executed by a computer cause the computer to perform a method, the method comprising:
   accessing an under-sampled data set that is associated with a scan of an object to be imaged performed by a medical imaging apparatus;
   producing an under-sampled approximation of the under-sampled data from previously acquired data;
   producing a sparsified data set from the under-sampled approximation and the under-sampled data set;
   producing a fully-sampled approximation of the under-sampled raw data set;
   storing the sparsified data set on a computer-readable medium;
   selectively reconstructing the sparsified data set into a sparse image;
   producing a final reconstructed image from the sparse image and the fully sampled approximation; and
   storing the final reconstructed image on a computer-readable medium.

2. The computer-readable medium of claim 1, where the apparatus is one of, a magnetic resonance imaging (MRI) apparatus, a computed tomography (CT) apparatus, a positron emission tomography (PET) apparatus, a fluorescence molecular tomography (FMT) apparatus, and a single positron emission computed tomography (SPECT) apparatus.

3. The computer-readable medium of claim 1, where the previously acquired data comprises fully sampled data.

4. The computer-readable medium of claim 3, where producing the under-sampled approximation comprises performing a principle component analysis (PCA) on the previously acquired data.

5. The computer-readable medium of claim 4, where producing the fully-sampled approximation comprises:
   identifying coefficients of a linear combination that produced the under-sampled approximation; and
   applying the coefficients to fully sampled eigenvectors associated with the fully sampled data to compute the fully-sampled approximation.

6. The computer-readable medium of claim 1, the method comprising controlling an MRI apparatus to acquire the under-sampled data set according to a set of acquisition parameters, where the set of acquisition parameters includes one or more of, an acceleration factor, an acquisition pattern, and a number of auto-calibration signal (ACS) lines to acquire.

7. The computer-readable medium of claim 1, where the previously acquired data includes data not acquired from the object being imaged.

8. The computer-readable medium of claim 1, where selectively reconstructing the sparsified data set into the sparse image comprises applying a sparse data reconstruction technique to the sparsified data set.

9. The computer-readable medium of claim 1, the scan being a brain scan performed by an MRI apparatus.

10. The computer-readable medium of claim 9, the previously acquired data being associated with fully sampled brain scans performed by an MRI apparatus, where the fully sampled brain scans were performed on brains other than the object to be imaged.

11. The computer-readable medium of claim 1, where producing the sparsified data set from the under-sampled approximation and the under-sampled data set comprises subtracting the under-sampled approximation from the under-sampled data set.

12. The computer-readable medium of claim 1, where selectively reconstructing the sparsified data set into the sparsified image comprises applying one or more of, a parallel reconstruction technique, a GRAPPA reconstruction, a Compressed Sensing reconstruction, a multiparametric optimization reconstruction, and a parallel sparse data reconstruction to the sparsified data set.

13. The computer-readable medium of claim 1, the method comprising:
pre-processing one or more of, the under-sampled data set and the under sampled approximation before producing the sparsified data set, where the pre-processing comprises one or more of, registration, linear combination, non-linear combination, and principal component analysis.

14. The computer-readable medium of claim 6, the method comprising:
selectively controlling the MRI apparatus to re-acquire the under-sampled data set according to a different set of acquisition parameters, where the set of acquisition parameters are selected as a function of one or more attributes of the sparsified data set.

15. An apparatus, comprising:
an under-sampling logic configured to access an under-sampled MRI brain scan for a brain to be imaged;
a data store to store a previously acquired fully-sampled MRI brain scan, where the fully sampled MRI brain scan is of a brain other than the brain to be imaged;
an approximation logic configured to produce an under-sampled approximation of the under-sampled MRI brain scan from one or more of the fully-sampled MRI brain scans; and
a sparsification logic configured to produce a sparse data set from the under-sampled MRI brain scan and the under-sampled approximation.

16. The apparatus of claim 15, comprising a reconstruction logic configured to reconstruct a sparse image from the sparse data set.

17. The apparatus of claim 16, where the reconstruction logic is configured to reconstruct the sparse image from the sparse data set using one of, a parallel reconstruction, a GRAPPA reconstruction, a Compressed Sensing reconstruction, a multiparametric optimization reconstruction, and a parallel sparse data reconstruction.

18. The apparatus of claim 16, where the approximation logic is configured to produce a fully-sampled approximation of the under-sampled MRI brain scan from one or more of the fully-sampled MRI brain scans.

19. The apparatus of claim 18, comprising a combination logic configured to produce a final image from the fully-sampled approximation and the sparse image.

20. The apparatus of claim 19, where the combination logic is configured to produce the final image by adding the sparse image to the fully-sampled approximation.

21. The apparatus of claim 15, where the approximation logic is configured to produce the under-sampled approximation from one or more of the fully-sampled MRI brain scans by performing a principal component analysis on one or more of the fully-sampled MRI brain scans.

22. The apparatus of claim 15, where the sparsification logic is configured to produce the sparse data set from the under-sampled MRI brain scan and the under-sampled approximation by subtracting the under-sampled approximation from the under-sampled MRI brain scan.

23. The apparatus of claim 15, where the under-sampled MRI brain scan comprises data associated with a nuclear magnetic resonance signal emitted by a portion of a human brain.

24. The apparatus of claim 15, the apparatus being integrated into an MRI apparatus.

25. The apparatus of claim 19, the apparatus being integrated into an MRI apparatus.

26. A system, comprising:
means for isolating difference information in an under-sampled medical imaging data set associated with an imaged object by removing data associated with an expected signal in the under-sampled medical imaging data set by referencing previously acquired medical imaging data associated with the expected signal;
means for reconstructing the difference information; and
means for providing an image of the object, the image comprising a portion associated with the reconstruction of the difference information and a portion associated with expected signal associated with an approximation of the under-sampled medical imaging data set.

27. The system of claim 26, the medical imaging data set being acquired from one or more of, a magnetic resonance imaging (MRI) apparatus, a computed tomography (CT) apparatus, a positron emission tomography (PET) apparatus, a fluorescence molecular tomography (FMT) apparatus, and a single positron emission computed tomography (SPECT) apparatus.

28. A method for controlling a computer to process medical imaging data, comprising:
controlling the computer to acquire an initial medical imaging data set;
controlling the computer to produce a sparsified medical imaging data set by removing information from the initial medical imaging data set that can be accounted for by data stored in a previously acquired medical imaging data set; and
controlling the computer to provide the sparsified medical imaging data set.

29. The method of claim 28, comprising;
selectively controlling a medical imaging apparatus based, at least in part, on the sparsified medical imaging data set.

30. The method of claim 28, where the previously acquired medical imaging data set includes data from at least one patient other than the patient from which the initial medical imaging data set is acquired.

* * * * *